(12) United States Patent
Kim et al.

(10) Patent No.: US 12,184,290 B2
(45) Date of Patent: Dec. 31, 2024

(54) PAM-4 RECEIVER USING PATTERN-BASED CLOCK AND DATA RECOVERY CIRCUITRY

(71) Applicant: Korea University Research and Business Foundation, Seoul (KR)

(72) Inventors: Chulwoo Kim, Seoul (KR); Seung-Woo Park, Seoul (KR); Yoon-Jae Choi, Seoul (KR); Jin-Cheol Sim, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 71 days.

(21) Appl. No.: 18/081,027

(22) Filed: Dec. 14, 2022

(65) Prior Publication Data

US 2023/0421160 A1  Dec. 28, 2023

(30) Foreign Application Priority Data

Jun. 23, 2022  (KR) .......................... 10-2022-0076956

(51) Int. Cl.
*H03L 7/08* (2006.01)
*H03K 3/0233* (2006.01)
*H03L 7/097* (2006.01)

(52) U.S. Cl.
CPC ....... *H03L 7/0807* (2013.01); *H03K 3/02332* (2013.01); *H03L 7/097* (2013.01)

(58) Field of Classification Search
CPC .... H03L 7/0807; H03L 7/097; H03K 3/02332
See application file for complete search history.

(56) References Cited

U.S. PATENT DOCUMENTS

| | | | |
|---|---|---|---|
| 2019/0089466 A1* | 3/2019 | Li | H04B 10/5161 |
| 2019/0173661 A1* | 6/2019 | Aleksic | H04L 25/03057 |
| 2021/0067312 A1* | 3/2021 | Kawasoe | H03L 7/091 |
| 2022/0329247 A1* | 10/2022 | van Ierssel | H03L 7/093 |
| 2022/0385444 A1* | 12/2022 | Yue | H03L 7/0812 |
| 2023/0037860 A1* | 2/2023 | Wang | H04L 25/03057 |

(Continued)

FOREIGN PATENT DOCUMENTS

| | | |
|---|---|---|
| KR | 10-2019-0052472 A | 5/2019 |
| KR | 10-2020-0096159 A | 8/2020 |

(Continued)

OTHER PUBLICATIONS

Korean Office Action Issued on May 20, 2024, in Counterpart Korean Patent Application No. 10-2022-0076956 (5 Pages in Korean).

*Primary Examiner* — Jaison Joseph
(74) *Attorney, Agent, or Firm* — NSIP Law

(57) ABSTRACT

Disclosed in a PAM-4 receiver using pattern-based clock and data recovery circuitry, which includes an analog front end that receives an external signal and recovers channel loss to output a refined PAM-4 signal, a comparison unit that receives the PAM-4 signal and compares the PAM-4 signal with a reference voltage to generate a recovery signal, and a recovery unit that receives the recovery signal and recovers data and a clock. The analog front end includes an equalizer that matches amplitudes of all frequency components of the external signal and an amplifier that amplifies an output signal of the equalizer.

11 Claims, 11 Drawing Sheets

(56) References Cited

U.S. PATENT DOCUMENTS

| | | | | |
|---|---|---|---|---|
| 2023/0054834 A1* | 2/2023 | Manjunath | .......... | H04L 25/4917 |
| 2023/0299783 A1* | 9/2023 | Araki | .................. | H03M 1/0624 |
| | | | | 341/120 |
| 2023/0421160 A1* | 12/2023 | Kim | ........................ | H03L 7/087 |

FOREIGN PATENT DOCUMENTS

| | | |
|---|---|---|
| KR | 10-2203390 B1 | 1/2021 |
| KR | 10-2346845 B1 | 1/2022 |
| KR | 10-2367086 B1 | 2/2022 |
| KR | 10-2022-0063770 A | 5/2022 |

\* cited by examiner

| V | DR0 | DR1 | DR2 | 41N1 | 41N2 | 41N3 (DOUT1) | 41N4 (DOUT2) | |
|---|---|---|---|---|---|---|---|---|
| +3 | 1 | 1 | 1 | 0 | 1 | 1 | 1 | 11 |
| +1 | 0 | 1 | 1 | 0 | 1 | 1 | 0 | 10 |
| −1 | 0 | 1 | 0 | 1 | 0 | 0 | 1 | 01 |
| −3 | 0 | 0 | 0 | 1 | 0 | 0 | 0 | 00 |

PAM-4 RECEIVER USING PATTERN-BASED CLOCK AND DATA RECOVERY CIRCUITRY

CROSS-REFERENCE TO RELATED APPLICATIONS

This application claims priority under 35 U.S.C. § 119 to Korean Patent Application No. 10-2022-0076956 filed on Jun. 23, 2022, in the Korean Intellectual Property Office, the disclosures of which are incorporated by reference herein in their entireties.

BACKGROUND

Embodiments of the present disclosure described herein relate to a pulse amplitude modulation-4 (PAM-4) receiver, and more particularly, relate to a PAM-4 receiver using clock and data recovery (CDR) circuitry which recovers data and a clock.

With the development of the data transmission system, Speeds have increased along with improvements in power efficiency for serial lines over the past few years. However, when transmission and reception is performed through a non return to zero (NRZ) signal at a high speed, there is a limitation of bandwidth due to the limitations of the channel and IC process. Thus, when the signal is processed at several levels, a small number of IO ports may transmit data at a high speed. However, as the level increases, the amount of data transmission increases. However, because too many levels are able to lead to another recognition error, a pulse amplitude modulation-4 (PAM-4) using four voltage levels is widely used.

A PAM-4 signaling method is a signaling method capable of transmitting 2 bits during one unit interval (UI). Because of using only half a bandwidth compared to an NRZ signaling method, the PAM-4 signaling method is used for a system for high-speed transmission and reception. A 2× oversampling clock and data recovery (CDR) circuit is mainly used in a CDR circuit OF an existing PAM-4 signaling method. Because of using an additional phase at a clock, the 2× oversampling CDR circuit is more likely to cause jitter due to a mismatch problem or the like, and also increases power consumption.

SUMMARY

Embodiments of the present disclosure provide a PAM-4 receiver for recovering a clock at a baud-rate using a pattern without the necessity of an additional phase, increasing a bandwidth of an analog front end (AFE) using less comparators to consequentially reduce power consumption in the process of recovering the clock and data.

According to an embodiment, a PAM-4 receiver using pattern-based clock and data recovery circuitry may include an analog front end that receives an external signal and recover channel loss to output a refined PAM-4 signal, a comparison unit that receives the PAM-4 signal and compares the PAM-4 signal with a reference voltage to generate a recovery signal, and a recovery unit that receives the recovery signal and recovers data and a clock.

In an embodiment, the analog front end may include an equalizer that matches amplitudes of all frequency components of the external signal and an amplifier that amplifies an output signal of the equalizer.

In an embodiment, the comparison unit may include a first phase comparator that compares the PAM-4 signal with the reference voltage, when the clock is 0 degree, a second phase comparator that compares the PAM-4 signal with the reference voltage, when the clock is 90 degrees, a third phase comparator that compares the PAM-4 signal with the reference voltage, when the clock is 180 degrees, and a fourth phase comparator that compares the PAM-4 signal with the reference voltage, when the clock is 270 degrees.

In an embodiment, each of the first to fourth phase comparators may include a high voltage (VH) comparator that outputs No. 0 data recovery value and No. 0 data recovery opposite value, a low voltage (VL) comparator that outputs No. 1 data recovery value and No. 1 data recovery opposite value using a signal differential voltage between a positive voltage and a negative voltage and a reference low voltage, a middle high voltage (VHM) comparator that outputs a first positive-side switching signal, a first negative-side switching signal, No. 0 clock recovery value, and No. 0 data recovery opposite value using the signal differential voltage between the positive voltage and the negative voltage and a reference middle high voltage, a middle low voltage (VLM) comparator that outputs a second positive-side switching signal, a second negative-side switching signal, No. 1 clock recovery value, and No. 1 clock recovery opposite value using the signal differential voltage between the positive voltage and the negative voltage and a reference middle low voltage, and a time-based decoder that outputs No. 2 data recovery value using the first positive-side switching signal and the first negative-side switching signal of the VHM comparator and the second positive-side switching signal and the second negative-side switching signal of the VLM comparator.

In an embodiment, the VH comparator may include a VH internal comparator that compares the signal differential voltage between the positive voltage and the negative voltage with a reference high voltage to output a signal corresponding to "1" or "0" at a positive-side output side and output a signal corresponding to "0" or "1" at a negative-side output side, a first phase inverter that receives the signal of the positive-side output side of the VH internal comparator and switches a phase of the received signal, a second phase inverter that receives a signal of the first phase inverter and switches a phase of the received signal, a third phase inverter that receives the signal of the negative-side output side of the VH internal comparator and switches a phase of the received signal, a fourth phase inverter that receives a signal of the second phase inverter and switches a phase of the received signal, and a set-reset (SR) latch that receives an output signal of the second phase inverter and an output signal of the fourth phase inverter and outputs "0" or "1".

In an embodiment, the VL comparator may include a VL internal comparator that compares the signal differential voltage between the positive voltage and the negative voltage with the reference low voltage to output a signal corresponding to "1" or "0" at a positive-side output side and output a signal corresponding to "0" or "1" at a negative-side output side, a first phase inverter that receives the signal of the positive-side output side of the VL internal comparator and switches a phase of the received signal, a second phase inverter that receives a signal of the first phase inverter and switches a phase of the received signal, a third phase inverter that receives the signal of the negative-side output side of the VL internal comparator and switches a phase of the received signal, a fourth phase inverter that receives a signal of the second phase inverter and switches a phase of the received signal, and an SR latch that receives an output signal of the second phase inverter and an output signal of the fourth phase inverter and outputs "0" or "1".

In an embodiment, the VHM comparator may include a VHM internal comparator that compares the signal differential voltage between the positive voltage and the negative voltage with the reference middle high voltage to output a signal corresponding to "1" or "0" at a positive-side output side and output a signal corresponding to "0" or "1" at a negative-side output side, a first phase inverter that receives the signal of the positive-side output side of the VHM internal comparator and switches a phase of the received signal to output a first positive-side switching signal, a second phase inverter that receives the first positive-side switching signal and switches a phase of the first positive-side switching signal, a third phase inverter that receives the signal of the negative-side output side of the VHM internal comparator and switches a phase of the received signal to output a first negative-side switching signal, a fourth phase inverter that receives the first negative-side switching signal and switches a phase of the first negative-side switching signal, and an SR latch that receives an output signal of the second phase inverter and an output signal of the fourth phase inverter and outputs "0" or "1".

In an embodiment, the VLM comparator may include a VLM internal comparator that compares the signal differential voltage between the positive voltage and the negative voltage with the reference middle low voltage to output a signal corresponding to "1" or "0" at a positive-side output side and output a signal corresponding to "0" or "1" at a negative-side output side, a first phase inverter that receives the signal of the positive-side output side of the VLM internal comparator and switches a phase of the received signal to output a second positive-side switching signal, a second phase inverter that receives the second positive-side switching signal and switches a phase of the second positive-side switching signal, a third phase inverter that receives the signal of the negative-side output side of the VLM internal comparator and switches a phase of the received signal to output a second negative-side switching signal, a fourth phase inverter that receives the second negative-side switching signal and switches a phase of the second negative-side switching signal, and an SR latch that receives an output signal of the second phase inverter and an output signal of the fourth phase inverter and outputs "0" or "1".

In an embodiment, the time-based decoder may receive the first positive-side switching signal, the first negative-side switching signal, the second positive-side switching signal, and the second negative-side switching signal and may output No. 2 data recovery value using a difference between an amount of current according to a difference between the first positive-side switching signal and the first negative-side switching signal and an amount of current according to a difference between the second positive-side switching signal and the second negative-side switching signal.

In an embodiment, the recovery unit may include a data recovery unit that receives data recovery values from first to fourth phase comparators and recovers the data and a clock recovery unit that receives clock recovery values from the first to fourth phase comparators and recovers the clock.

In an embodiment, the data recovery unit may include a first data recoverer that receives a first recovery signal of the first phase comparator and recover the data, a second data recoverer that receives a second recovery signal of the second phase comparator and recovers the data, a third data recoverer that receives a third recovery signal of the third phase comparator and recovers the data, and a fourth data recoverer that receives a fourth recovery signal of the fourth phase comparator and recovers the data.

In an embodiment, each of the first to fourth data recovers may recover the data using a NAND gate.

In an embodiment, the clock recovery unit may include a voting machine that generates a clock adjustment signal using No. 0 clock recovery value, No. 1 clock recovery value, a first value of the adjusted data, and a second value of the recovered data and an oscillator that receives the clock adjustment signal and generate an adjusted clock.

In an embodiment, the voting machine may include a pattern unit that finds four rising patterns and four falling patterns for three consecutive timings and generates an early signal, a late signal, and a no pattern signal using the four rising patterns and the four falling patterns and a voting unit that generates the clock adjustment signal on the basis of a signal occupying half of the early signal, the late signal, and the no pattern signal generated by the pattern unit.

BRIEF DESCRIPTION OF THE FIGURES

The above and other objects and features of the present disclosure will become apparent by describing in detail embodiments thereof with reference to the accompanying drawings.

DETAILED DESCRIPTION

Below, embodiments of the present disclosure may be described in detail and clearly to such an extent that an ordinary one in the art easily implements the invention.

Figure 1:
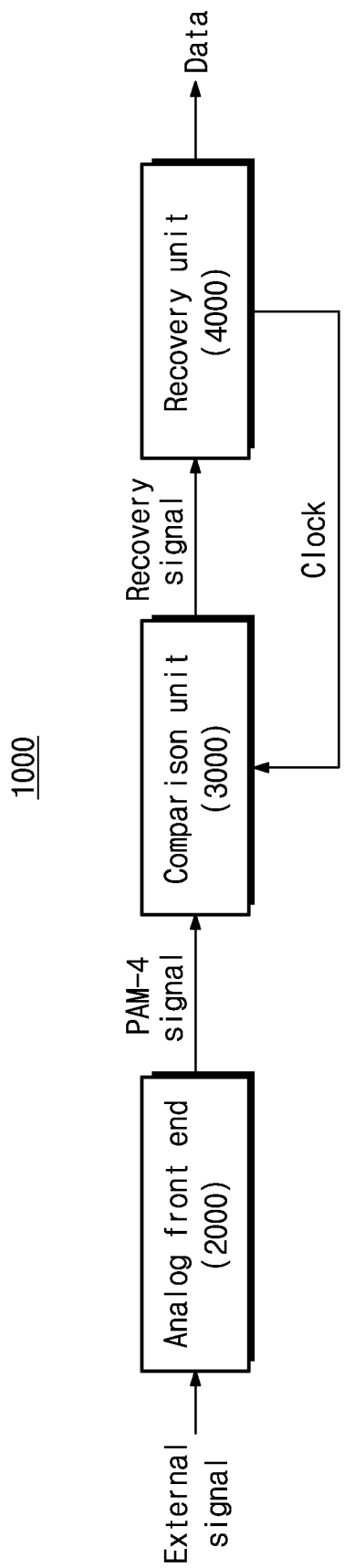
FIG. 1 is a block diagram illustrating a configuration of a PAM-4 receiver using pattern-based CDR circuitry according to an embodiment of the present disclosure.

FIG. 1 is a block diagram illustrating a configuration of a PAM-4 receiver using pattern-based CDR circuitry according to an embodiment of the present disclosure. Referring to FIG. 1, a PAM-4 receiver 1000 using pattern-based CDR circuitry may include an analog front end (AFE) 2000, a comparison unit 3000, and a recovery unit 4000. The PAM-4 receiver 1000 using the pattern-based CDR circuitry may receive a PAM-4 signal and may recover data and a clock.

The AFE 2000 may receive an external signal. The AFE 2000 may recover channel loss from the received signal to output a PAM-4 signal of a refined waveform.

The comparison unit 3000 may compare the received PAM-4 signal with intensity of a reference voltage Vref. The comparison unit 3000 may output a recovery signal including a result where the PAM-4 signal is greater than or less than the reference voltage Vref.

The recovery unit 4000 may receive the recovery signal output by the comparison unit 3000 and may recover data and a clock.

Figure 2:
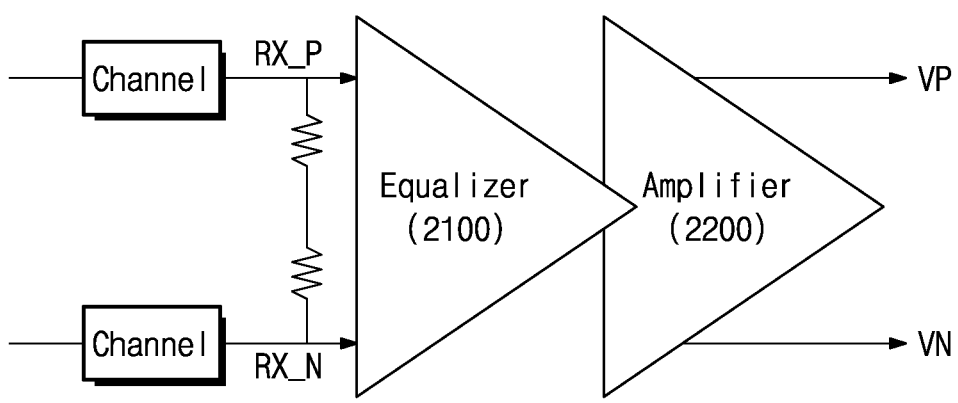
FIG. 2 is a drawing illustrating a configuration of an analog front end of FIG. 1.

FIG. 2 is a drawing illustrating a configuration of an analog front end (AFE) of FIG. 1. Referring to FIG. 2, an AFE 2000 may include an equalizer 2100 and an amplifier 2200.

The equalizer 2100 may match all frequency components of an input signal to a similar magnitude (or amplitude). The equalizer 2100 may amplify magnitudes of high frequency components with continuous time linear equalization (CTLE) and may match the magnitudes (or amplitudes), thus improving performance of a jitter and an eye diagram.

The amplifier 2200 may amplify a magnitude of the input signal. Herein, the amplifier 2200 may adjust a gain of a signal amplified with a variable gain amplifier (VGA). The amplifier 2200 may amplify the magnitude of the signal to output a positive voltage (VP) and a negative voltage VN.

The positive voltage VP and the negative voltage VN output by the amplifier 2200 may be converted into a form of differential voltage to be used as a PAM-4 signal.

Figure 3:
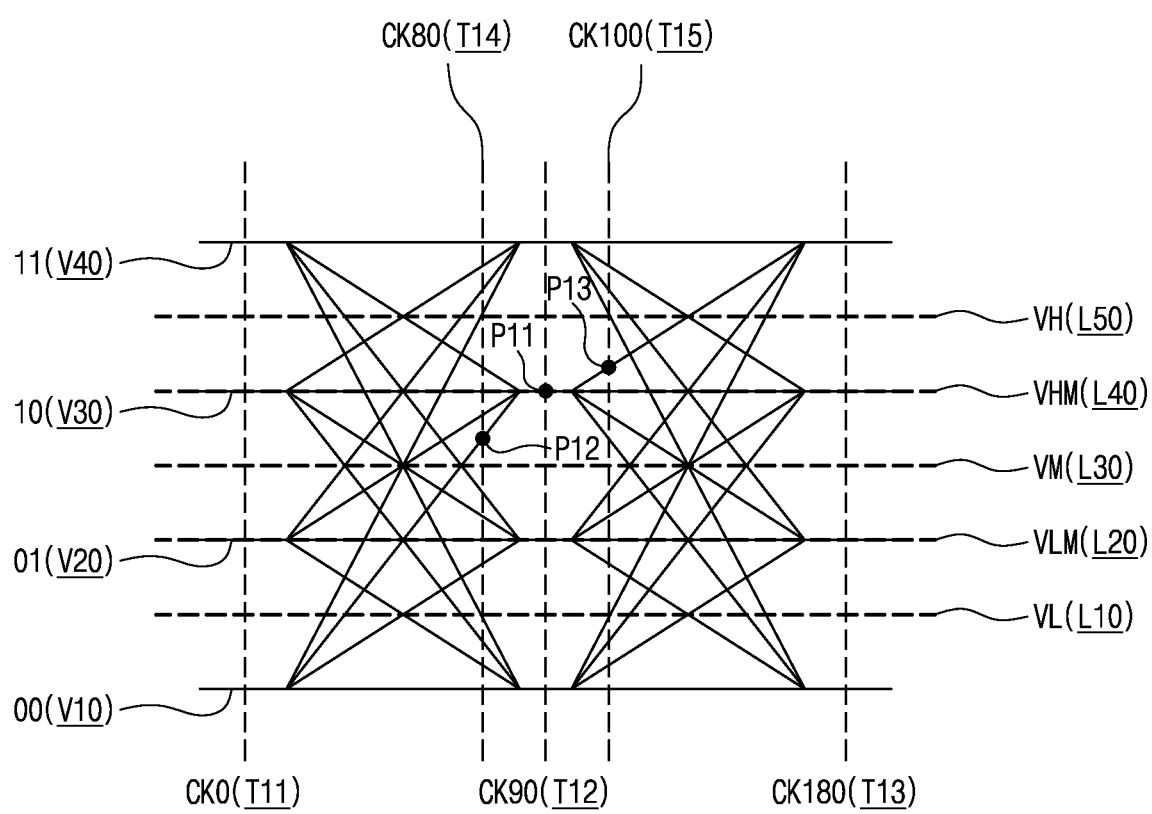
FIG. 3 is a drawing illustrating the distribution of waveforms of a PAM-4 signal and reference voltages Vref of an existing comparator.

FIG. 3 is a drawing illustrating the distribution of waveforms of a PAM-4 signal and reference voltages Vref of an existing comparator. Referring to FIG. 3, the waveforms of the PAM-4 signal may be distributed in a total of 4 levels 00(V10), 01(V20), 10(V30), and 11(V40), and the reference voltages Vref of the existing comparator may be distributed in a total of 5 levels VL(L10), VLM(L20), VM(L30), VHM(L40), and VH(L50).

A signal modulated in a scheme which modulates a pulse and an amplitude of the PAM-4 signal may correspond to one of 00(V10), 01(V20), 10(V30), or 11(V40). The voltage value of the PAM-4 signal may have −3 V in a signal of 00(V10), may have −1 V in a signal of 01(V20), may have +1 V in a signal of 10(V30), and may have +3 V in a signal of 11(V40). The voltage value of the PAM-4 signal is illustrative, which may have a different voltage value depending on its implementation.

The reference voltage Vref may be a voltage provided as a reference for comparison with the PAM-4 signal. The value of each reference voltage Vref may have −2 V in VL(L10), may have −1 V in VLM(L20), may have 0 V in VM(L30), may have +1 V in VHM(L40), and may have +2 V in VH(L50), which may vary with a voltage value of the PAM-4 signal. Each reference voltage Vref may be implemented using a comparator. Thus, when there are five reference voltages Vref, five comparators are required.

The comparator may use an eye diagram of the PAM-4 signal to recover a clock and data. The comparator may perform sampling at timings of CK0(T11), CK90(T12), CK180(T13), and Ck270 (not shown in FIG. 3) where the largest eye pattern is formed in the eye diagram.

The existing comparator uses VL(L10), VM(L30), and VH(L50) to recover data. When the V10 signal is input, the existing comparator may recognize that the V10 signal is less than VL(L10) to recover data 00. When the V20 signal is input, the existing comparator may recognize that the V20 signal is greater than VL(L10) and is less than VM(L30) to recover data 01. Likewise, when the V30 signal is input, the existing comparator may recognize that the V30 signal is greater than VM(L30) and is less than VH(L50) to recover data 10. When the V40 signal is input, the existing comparator may recognize that the V40 signal is greater than VH(L50) to recover data 11.

The comparator may use VLM(L20) and VHM(L40) to recover a clock. When the V30 signal is input, the comparator may recognize that the V30 signal is greater than VM(L30) and is less than VH(L50) to recover data 10. At this time, when the V30 signal is the same as VHM(L40) (P11), the comparator may determine that the phase is accumulated located at CK90(T12). However, at this time, when the V30 signal is the less than VHM(L40) (P12), the comparator may recognize that the V30 signal is an early state to determine that the clock should be moved to the right. On the other hand, when the V30 signal is the greater than VHM(L40) (P13), the comparator may recognize that the V30 signal is in a late state to determine that the clock should be moved to the left.

Figure 4:
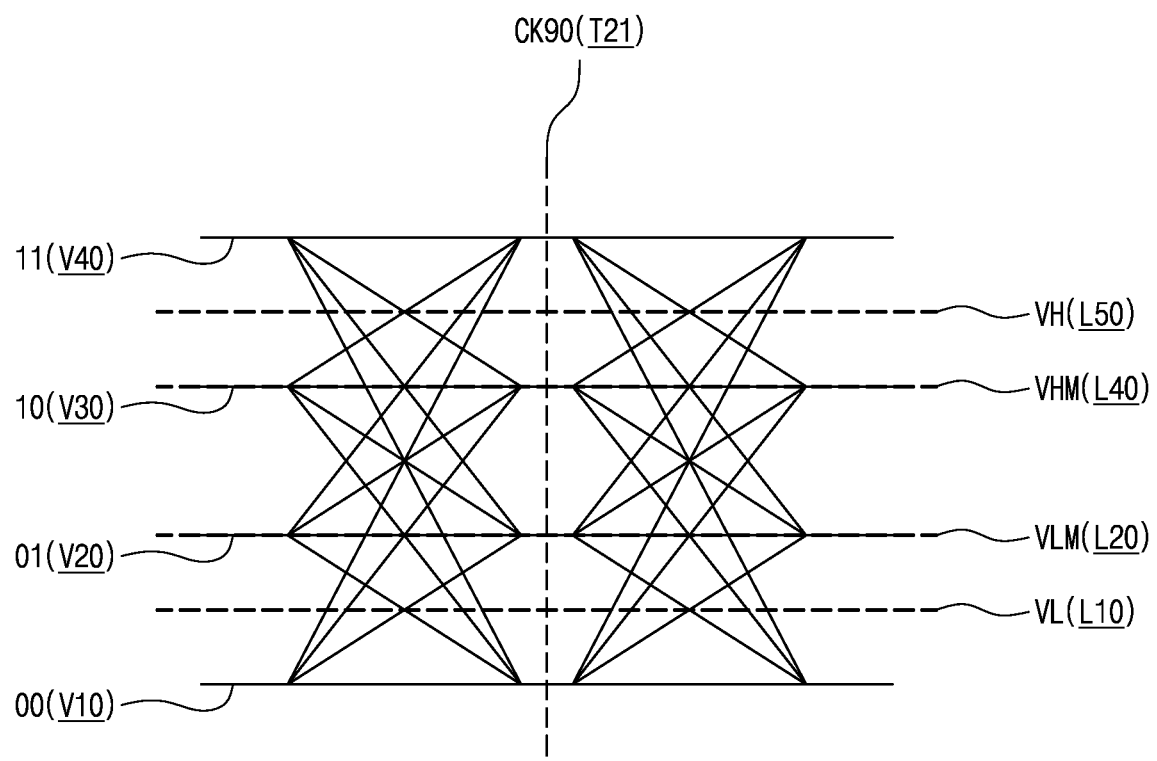
FIG. 4 is a drawing illustrating the distribution of waveforms of a PAM-4 signal and reference voltages Vref in the present disclosure.

FIG. 4 is a drawing illustrating the distribution of waveforms of a PAM-4 signal and reference voltages Vref in the present disclosure. Referring to FIG. 4, the waveforms of the PAM-4 signal may be distributed in a total of 4 levels 00(V10), 01(V20), 10(V30), and 11(V40), and the reference voltages Vref of a comparison unit 3000 of FIG. 1 may be distributed in a total of 4 levels VL(L10), VLM(L20), VHM(L40), and VH(L50).

Because the comparison unit 3000 according to the present disclosure uses four comparators unlike an existing scheme which uses five comparators, the comparison unit 3000 may increase a bandwidth by one reduced comparator, thus reducing power consumption. However, the signal of 01(V20) and the signal of 10(V30) should be recovered in a scheme different from an existing comparator. Hereinafter, a description will be given of a configuration for data recovery and clock recovery and a recovery method using the configuration.

Figure 5:
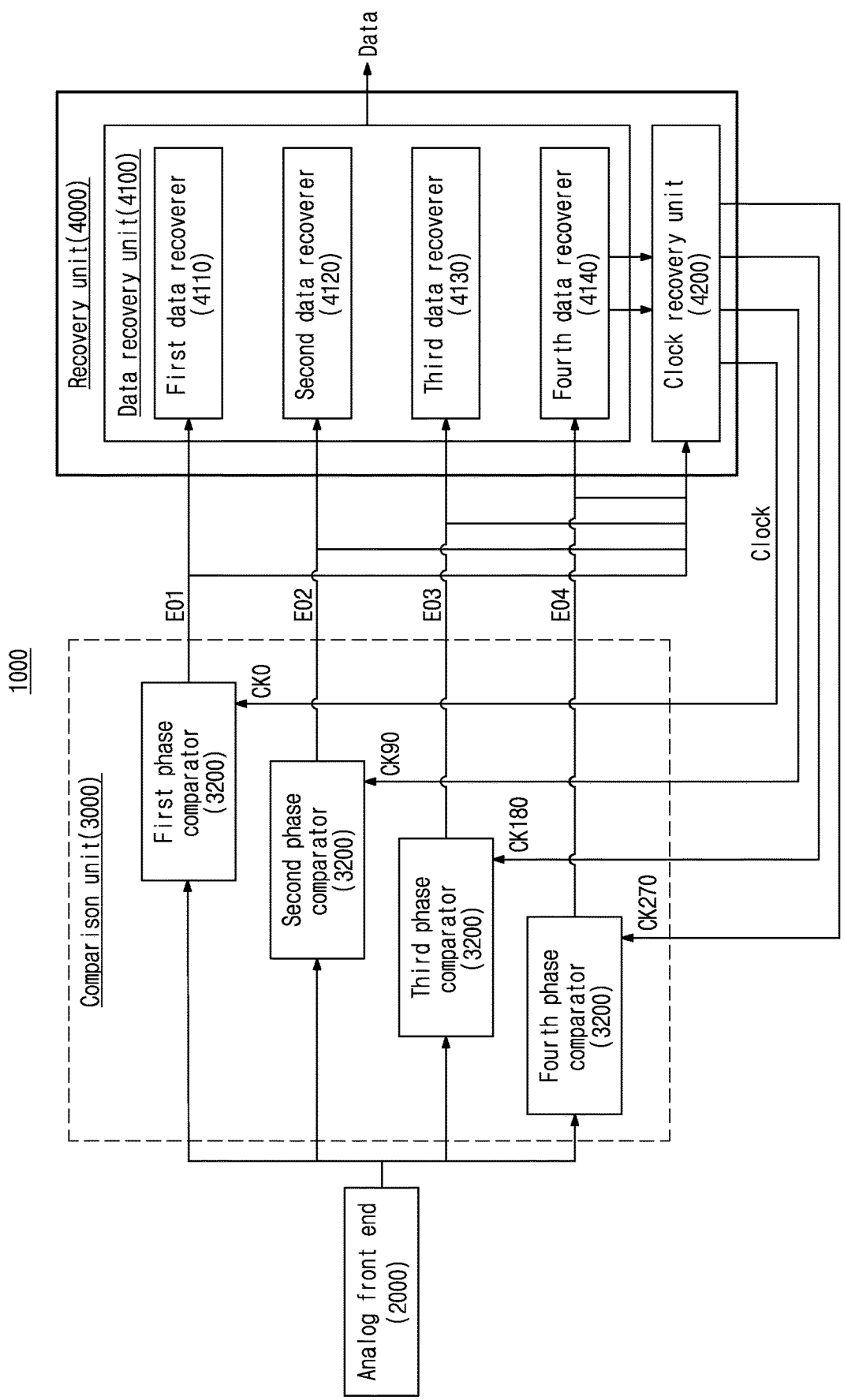
FIG. 5 is a block diagram illustrating in detail a configuration of a PAM-4 receiver using pattern-based CDR circuitry according to an embodiment of the present disclosure.

FIG. 5 is a block diagram illustrating in detail a configuration of a PAM-4 receiver using pattern-based CDR circuitry according to an embodiment of the present disclosure. Referring to FIG. 5, a PAM-4 receiver 1000 using pattern-based CDR circuitry may include an analog front end (AFE) 2000, a comparison unit 3000, and a recovery unit 4000.

The PAM-4 receiver 1000 using the pattern-based CDR circuitry and the AFE 2000 are the same as those described above with reference to FIG. 1.

The comparison unit 3000 may include a first phase comparator 3100, a second phase comparator 3200, a third phase comparator 3300, and a fourth phase comparator 3400. The comparison unit 3000 may compare a differential voltage (phase) input at a specific clock with a reference voltage Vref.

The first phase comparator 3100 may operate when the clock is 0 degree (CK0), and the second phase comparator 3200 may operate when the clock is 90 degrees (CK90). Likewise, the third phase comparator 3300 may operate when the clock is 180 degree (CK180), and the fourth phase comparator 3400 may operate when the clock is 270 degrees (CK270).

The first phase comparator 3100 may operate when the clock is 0 degree (CK0) and may output a first recovery signal (E01) including a digital recovery value of data and a digital recovery value of the clock. The second phase comparator 3200 may output a second recovery signal E02. The third phase comparator 3300 may output a third recovery signal E03. The fourth phase comparator 3400 may output a fourth recovery signal E04.

The first to fourth phase comparators 3100 to 3400 may have different operating clocks, may have the same configuration, and may perform the same operation. Hereinafter, to describe the same configuration, the first to fourth phase comparators 3100 to 3400 are integrated to be referred to as a phase comparator 3N00. The phase comparator 3N00 will be described in detail below with reference to FIG. 6.

The recovery unit 4000 may include a data recovery unit 4100 and a clock recovery unit 4200. The recovery unit 4000 may receive the recovery signal of the comparison unit 3000 to recover data and a clock.

The data recovery unit 4100 may include a first data recoverer 4110, a second data recoverer 4120, a third data recoverer 4130, and a fourth data recoverer 4140. The data recovery unit 4100 may receive digital recovery values of data from the recovery signals E01, E02, E03, and E04 of the phase comparator 3N00 and may recover the data.

The first data recoverer 4110 may receive the first recovery signal E01 of the first phase comparator 3100 and may recover the data. The second data recoverer 4120 may receive the second recovery signal E02 of the second phase comparator 3200 and may recover the data. Likewise, the third data recoverer 4130 may receive the third recovery signal E03 of the third phase comparator 3300 and may recover the data. The fourth data recoverer 4140 may receive the fourth recovery signal E04 of the fourth phase comparator 3400 and may recover the data.

The first to fourth data recovers 4110 to 4140 may have different operating clocks, may have the same configuration, and may perform the same operation. Hereinafter, the first to fourth data recovers 4110 to 4140 are integrated to be referred to as a data recoverer 41N0. The data recoverer 41N0 will be described in detail below with reference to FIG. 10.

The clock recovery unit 4200 may recover a clock. The clock recovery unit 4200 may recover the clock using the data output by the data recovery unit 4100 and the digital recovery values of the clock from the recovery signals E01, E02, E03, and E04 output by the phase comparator 3N00. The clock recovered by the clock recovery unit 4200 may be an input of the phase comparator 3N00. The clock recovery unit 4200 will be described in detail below with reference to FIG. 11.

Figure 6:
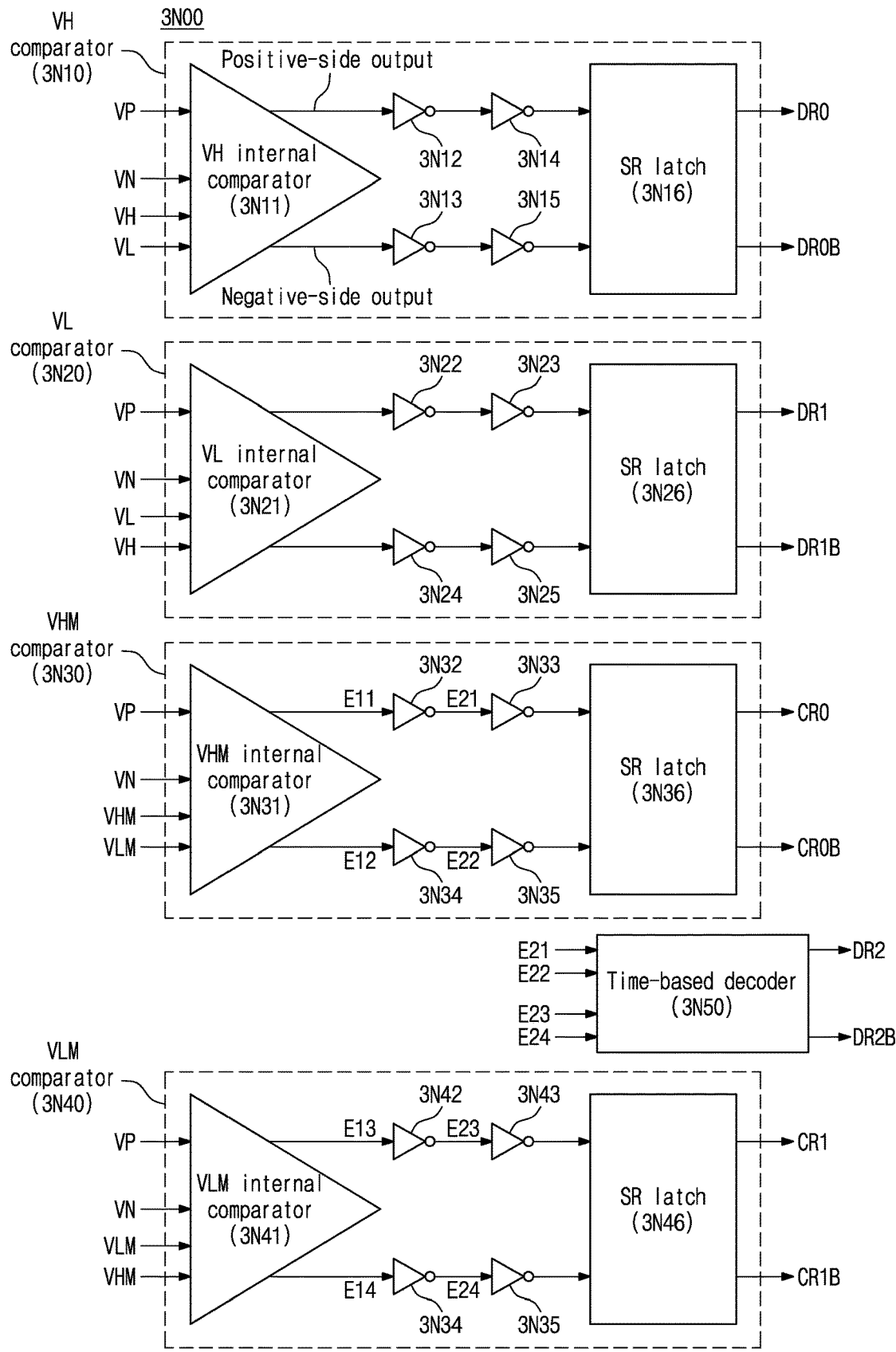
FIG. 6 is a block diagram illustrating in detail a configuration of each of first to fourth phase comparators of FIG. 5.

FIG. 6 is a block diagram illustrating in detail a configuration of each of first to fourth phase comparators of FIG. 5. Referring to FIG. 6, a phase comparator 3N00 may include a high voltage (VH) comparator 3N10, a low voltage (VL) comparator 3N20, a middle high voltage (VHM) comparator 3N30, a middle low voltage (VLM) comparator 3N40, and a time-based decoder 3N50.

The phase comparator 3N00 may receive a positive voltage VP and a negative voltage VN output by an AFE 2000 of FIG. 5. Furthermore, the phase comparator 3N00 may receive a reference high voltage VH, a reference low voltage VL, a reference middle high voltage VHM, and a reference middle low voltage VLM as reference voltages Vref.

The VH comparator 3N10 may include a VH internal comparator 3N11, four phase inverters 3N12, 3N13, 3N14, and 3N15, and a set-rest (SR) latch 3N16. The VH comparator 3N10 may receive the positive voltage VP and the negative voltage VN, which are outputs of an amplifier 2200 in FIG. 2. Furthermore, the VH comparator 3N10 may receive VH(L50) and VL(L10) in FIG. 4. The VH comparator 3N10 may output No. 0 data recovery value DR0 and No. 0 data recovery opposite value DR0B.

The VH internal comparator 3N11 may compare intensity of a signal differential voltage between the positive voltage VP and the negative voltage VN with intensity of the reference high voltage VH. When 11(V40) is input, the VH internal comparator 3N11 may determine that the signal differential voltage is greater than the reference high voltage VH. The VH internal comparator 3N11 may output a signal corresponding to "1" as a positive-side output and may output a signal corresponding to "0" as a negative-side output. When 00(V10), 01(V20), and 10(V30) are input, the VH internal comparator 3N11 may determine that the signal differential voltage is less than the reference high voltage VH. The VH internal comparator 3N11 may output a signal corresponding to "0" as a positive-side output and may output a signal corresponding to "1" as a negative-side output.

The VH comparator 3N10 may include four phase inverters (e.g., a first phase inverter 3N12, a second phase inverter 3N13, a third phase inverter 3N14, and a fourth phase inverter 3N15). The first phase inverter 3N12 and the second phase inverter 3N13 may be arranged continuously at the positive-side output side of the VH internal comparator 3N11, and the third phase inverter 3N14 and the fourth phase inverter 3N15 may be arranged continuously at the negative-side output side of the VH internal comparator 3N11. The first phase inverter 3N12 and the second phase inverter 3N13 may switch a phase of the positive-side output of the VH internal comparator 3N11 two times, and the third phase inverter 3N14 and the fourth phase inverter 3N15 may switch a phase of the negative-side output of the VH internal comparator 3N11.

The SR latch 3N16 may receive the positive-side output signal of the VH internal comparator 3N11, the phase of which switches two times, and the negative-side output signal of the VH internal comparator 3N11, the phase of which switches two times. When the positive-side output of the VH internal comparator 3N11 is "1" and the negative-side output of the VH internal comparator 3N11 is "0", the SR latch 3N16 may output "1" as No. 0 data recovery value DR0 and may output an opposite value "0" as No. 0 data recovery opposite value DR0B. When the positive-side output of the VH internal comparator 3N11 is "0" and the negative-side output of the VH internal comparator 3N11 is "1", the SR latch 3N16 may output "0" as No. 0 data recovery value DR0 and may output an opposite value "1" as No. 0 data recovery opposite value DR0B.

The VL comparator 3N20 may include a VL internal comparator 3N21, four phase inverters 3N22, 3N23, 3N24, and 3N25, and an SR latch 3N26. The VL comparator 3N20 may receive the positive voltage VP and the negative voltage VN, which are outputs of the amplifier 2200 in FIG. 2. Furthermore, the VL comparator 3N20 may receive VL(L10) and VH(L50) in FIG. 4. The VL comparator 3N20 may output No. 1 data recovery value DR1 and No. 1 data recovery opposite value DR1B.

The VL internal comparator 3N21 may compare intensity of a signal differential voltage between the positive voltage VP and the negative voltage VN with intensity of the reference low voltage VL. When 01(V20), 10(V30), and 11(V40) are input, the VL internal comparator 3N21 may determine that the signal differential voltage is greater than the reference low voltage VL. The VL internal comparator 3N21 may output a signal corresponding to "1" as a positive-side output and may output a signal corresponding to "0" as a negative-side output. When 00(V10) is input, the VL internal comparator 3N21 may determine that the signal differential voltage is less than the reference low voltage VL.

The VL internal comparator 3N21 may output a signal corresponding to "0" as a positive-side output and may output a signal corresponding to "1" as a negative-side output.

The VL comparator 3N20 may include four phase inverters (e.g., a first phase inverter 3N22, a second phase inverter 3N23, a third phase inverter 3N24, and a fourth phase inverter 3N25). The first phase inverter 3N22 and the second phase inverter 3N23 may be arranged continuously at the positive-side output side of the VL internal comparator 3N21, and the third phase inverter 3N24 and the fourth phase inverter 3N25 may be arranged continuously at the negative-side output side of the VL internal comparator 3N21. The first phase inverter 3N22 and the second phase inverter 3N23 may switch a phase of the positive-side output of the VL internal comparator 3N21 two times, and the third phase inverter 3N24 and the fourth phase inverter 3N25 may switch a phase of the negative-side output of the VL internal comparator 3N21.

The SR latch 3N26 may receive the positive-side output signal of the VL internal comparator 3N21, the phase of which switches two times, and the negative-side output signal of the VL internal comparator 3N21, the phase of which switches two times. When the positive-side output of the VL internal comparator 3N21 is "1" and the negative-side output of the VL internal comparator 3N21 is "0", the SR latch 3N26 may output "1" as No. 1 data recovery value DR1 and may output an opposite value "0" as No. 1 data recovery opposite value DR1B. When the positive-side output of the VL internal comparator 3N21 is "0" and the negative-side output of the VL internal comparator 3N21 is "1", the SR latch 3N26 may output "0" as No. 1 data recovery value DR1 and may output an opposite value "1" as No. 0 data recovery opposite value DR0B.

The VHM comparator 3N30 may include a VHM internal comparator 3N31, four phase inverters 3N32, 3N33, 3N34, and 3N35, and an SR latch 3N36. The VHM comparator 3N30 may receive the positive voltage VP and the negative voltage VN, which are outputs of the amplifier 2200 in FIG. 2. Furthermore, the VHM comparator 3N30 may receive VHM(L40) and VLM(L20) in FIG. 4. The VHM comparator 3N30 may output No. 0 clock recovery value CR0 and No. 0 clock recovery opposite value CR0B.

The VHM internal comparator 3N31 may compare intensity of a signal differential voltage between the positive voltage VP and the negative voltage VN with intensity of the reference middle high voltage VHM. When 11(V40) is input, the VHM internal comparator 3N31 may determine that the signal differential voltage is greater than the reference middle high voltage VHM. The VHM internal comparator 3N31 may output a signal corresponding to "1" as a positive-side output and may output a signal corresponding to "0" as a negative-side output. When 00(V10) and 01(V20) are input, the VHM internal comparator 3N31 may determine that the signal differential voltage is less than the reference middle high voltage VHM. The VHM internal comparator 3N31 may output a signal corresponding to "0" as a positive-side output and may output a signal corresponding to "1" as a negative-side output.

However, because the reference middle high voltage VHM used by the VHM internal comparator 3N31 is the same in intensity as a signal of 10(V30), a method for recovering the signal of 10(V30) will be described below together with the time-based decoder 3N50.

The VHM comparator 3N30 may include four phase inverters (e.g., a first phase inverter 3N32, a second phase inverter 3N33, a third phase inverter 3N34, and a fourth phase inverter 3N35). The first phase inverter 3N32 and the second phase inverter 3N33 may be arranged continuously at the positive-side output side of the VHM internal comparator 3N31, and the third phase inverter 3N34 and the fourth phase inverter 3N35 may be arranged continuously at the negative-side output side of the VHM internal comparator 3N31.

The first phase inverter 3N32 may receive a positive-side output E11 of the VHM internal comparator 3N31 and may output a first positive-side switching signal E21, the phase of which switches.

The second phase inverter 3N33 may receive a first positive-side switching signal E21 of the first phase inverter 3N22 and may output a signal, the phase of which switches.

The third phase inverter 3N34 may receive a negative-side output E12 of the VHM internal comparator 3N31 and may output a first negative-side switching signal E22, the phase of which switches.

The fourth phase inverter 3N35 may receive the first negative-side switching signal E22 of the third phase inverter 3N34 and may output a signal, the phase of which switches.

The SR latch 3N36 may receive the positive-side output signal of the VHM internal comparator 3N31, the phase of which switches two times, and the negative-side output signal of the VHM internal comparator 3N31, the phase of which switches two times. When the positive-side output of the VHM internal comparator 3N31 is "1" and the negative-side output of the VHM internal comparator 3N31 is "0", the SR latch 3N36 may output "1" as No. 0 clock recovery value CR0 and may output an opposite value "0" as No. 0 clock recovery opposite value CR0B. When the positive-side output of the VHM internal comparator 3N31 is "0" and the negative-side output of the VHM internal comparator 3N31 is "1", the SR latch 3N36 may output "0" as No. 0 clock recovery value CR0 and may output an opposite value "1" as No. 0 clock recovery opposite value CR0B.

The VLM comparator 3N40 may include a VLM internal comparator 3N41, four phase inverters 3N42, 3N43, 3N44, and 3N45, and an SR latch 3N46. The VLM comparator 3N40 may receive the positive voltage VP and the negative voltage VN, which are outputs of the amplifier 2200 in FIG. 2. Furthermore, the VLM comparator 3N40 may receive VHM(L40) and VLM(L20) in FIG. 4. The VLM comparator 3N40 may output No. 1 clock recovery value CR1 and No. 1 clock recovery opposite value CR1B.

The VLM internal comparator 3N41 may compare intensity of a signal differential voltage between the positive voltage VP and the negative voltage VN with intensity of the reference middle low voltage VLM. When 10(V30) and 11(V40) are input, the VLM internal comparator 3N41 may determine that the signal differential voltage is greater than the reference middle low voltage VLM. The VLM internal comparator 3N41 may output a signal corresponding to "1" as a positive-side output and may output a signal corresponding to "0" as a negative-side output.

When 00(V10) is input, the VLM internal comparator 3N41 may determine that the signal differential voltage is less than the reference middle low voltage VLM. The VLM internal comparator 3N41 may output a signal corresponding to "0" as a positive-side output and may output a signal corresponding to "1" as a negative-side output.

However, because the reference middle low voltage VLM used by the VLM internal comparator 3N41 is the same in intensity as a signal of 01(V20), a method for recovering the signal of 01(V20) will be described below together with the time-based decoder 3N50.

The VLM comparator 3N40 may include four phase inverters (e.g., a first phase inverter 3N42, a second phase inverter 3N43, a third phase inverter 3N44, and a fourth phase inverter 3N45). The first phase inverter 3N42 and the second phase inverter 3N43 may be arranged continuously at the positive-side output side of the VLM internal comparator 3N41, and the third phase inverter 3N44 and the fourth phase inverter 3N45 may be arranged continuously at the negative-side output side of the VLM internal comparator 3N41.

The first phase inverter 3N42 may receive a positive-side output E13 of the VLM internal comparator 3N41 and may output a second positive-side switching signal E23, the phase of which switches.

The second phase inverter 3N43 may receive a second positive-side switching signal E23 of the first phase inverter 3N22 and may output a signal, the phase of which switches.

The third phase inverter 3N44 may receive a negative-side output E14 of the VLM internal comparator 3N41 and may output a second negative-side switching signal E24, the phase of which switches.

The fourth phase inverter 3N45 may receive the second negative-side switching signal E24 of the third phase inverter 3N44 and may output a signal, the phase of which switches.

The SR latch 3N46 may receive the positive-side output signal of the VLM internal comparator 3N41, the phase of which switches two times, and the negative-side output signal of the VLM internal comparator 3N41, the phase of which switches two times. When the positive-side output of the VLM internal comparator 3N41 is "1" and the negative-side output of the VLM internal comparator 3N41 is "0", the SR latch 3N46 may output "1" as No. 1 clock recovery value CR1 and may output an opposite value "0" as No. 1 clock recovery opposite value CR1B. When the positive-side output of the VLM internal comparator 3N41 is "0" and the negative-side output of the VLM internal comparator 3N41 is "1", the SR latch 3N46 may output "0" as No. 1 clock recovery value CR1 and may output an opposite value "1" as No. 1 clock recovery opposite value CR1B.

The time-based decoder 3N50 may receive the first positive-side switching signal E21 output by the first phase inverter 3N32 of the VHM internal comparator 3N31, the first negative-side switching signal E22 output by the second phase inverter 3N33 of the VHM internal comparator 3N31, the second positive-side switching signal E23 output by the first phase inverter 3N42 of the VLM internal comparator 3N41, and the second negative-side switching signal E24 output by the second phase inverter 3N43 of the VLM internal comparator 3N41. The time-based decoder 3N50 may output No. 2 data recovery value DR2 and No. 2 data recovery opposite value DR2B using the received four signals E21, E22, E23, and E24.

The time-based decoder 3N50 may determine No. 2 data recovery value DR2 and No. 2 data recovery opposite value DR2B using the signal of 01(V20), the signal of 10(V30), and the amount of current according to a voltage difference between VHM(L40) and VLM(L20). The process where the time-based decoder 3N50 outputs No. 2 data recovery value DR2 and No. 2 data recovery opposite value DR2B will be described below with reference to FIGS. 7 and 8.

Figure 7:
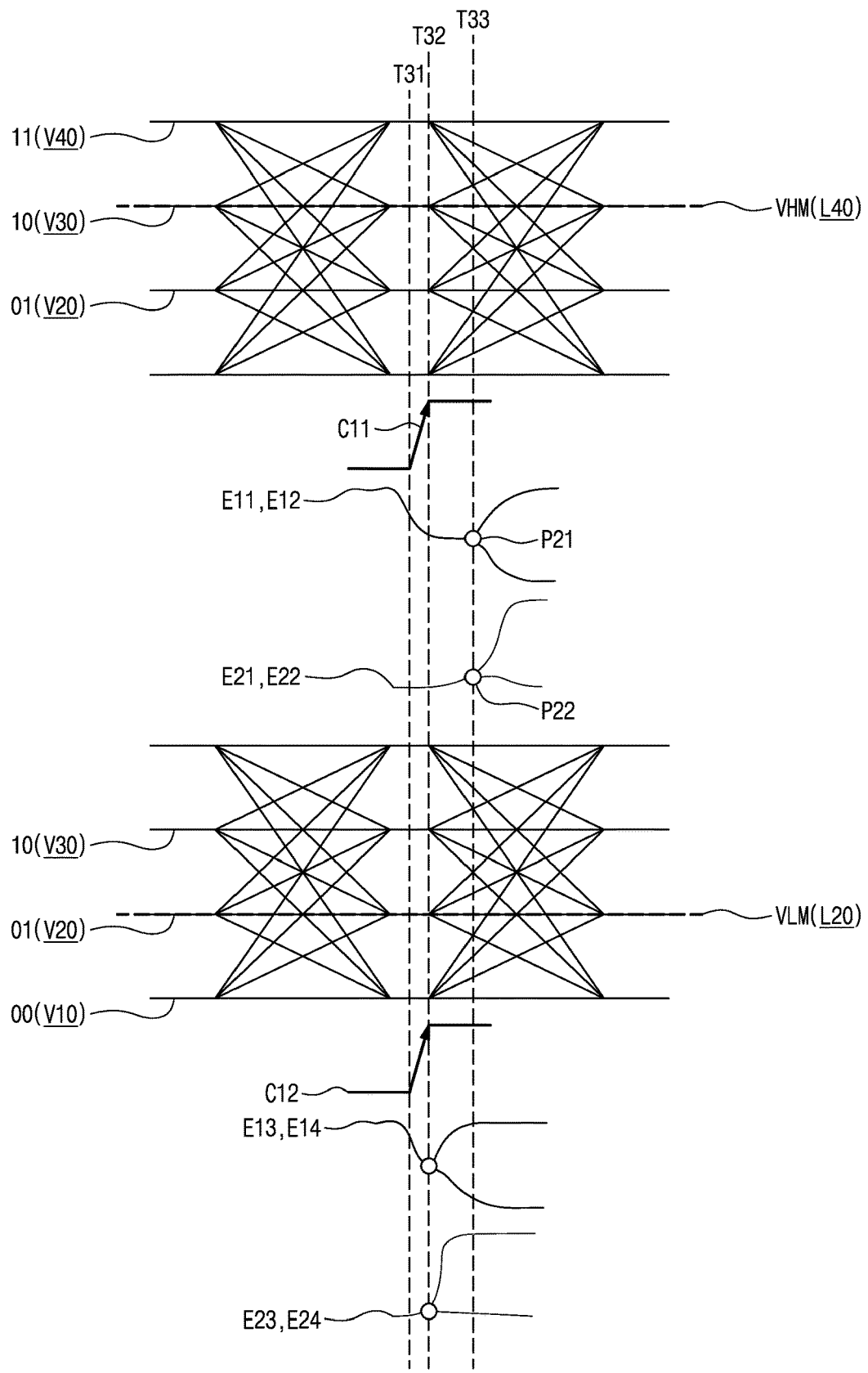
FIG. 7 is a drawing illustrating a form where a signal is changed when signal "10" is input to a time-based decoder.
Figure 8:
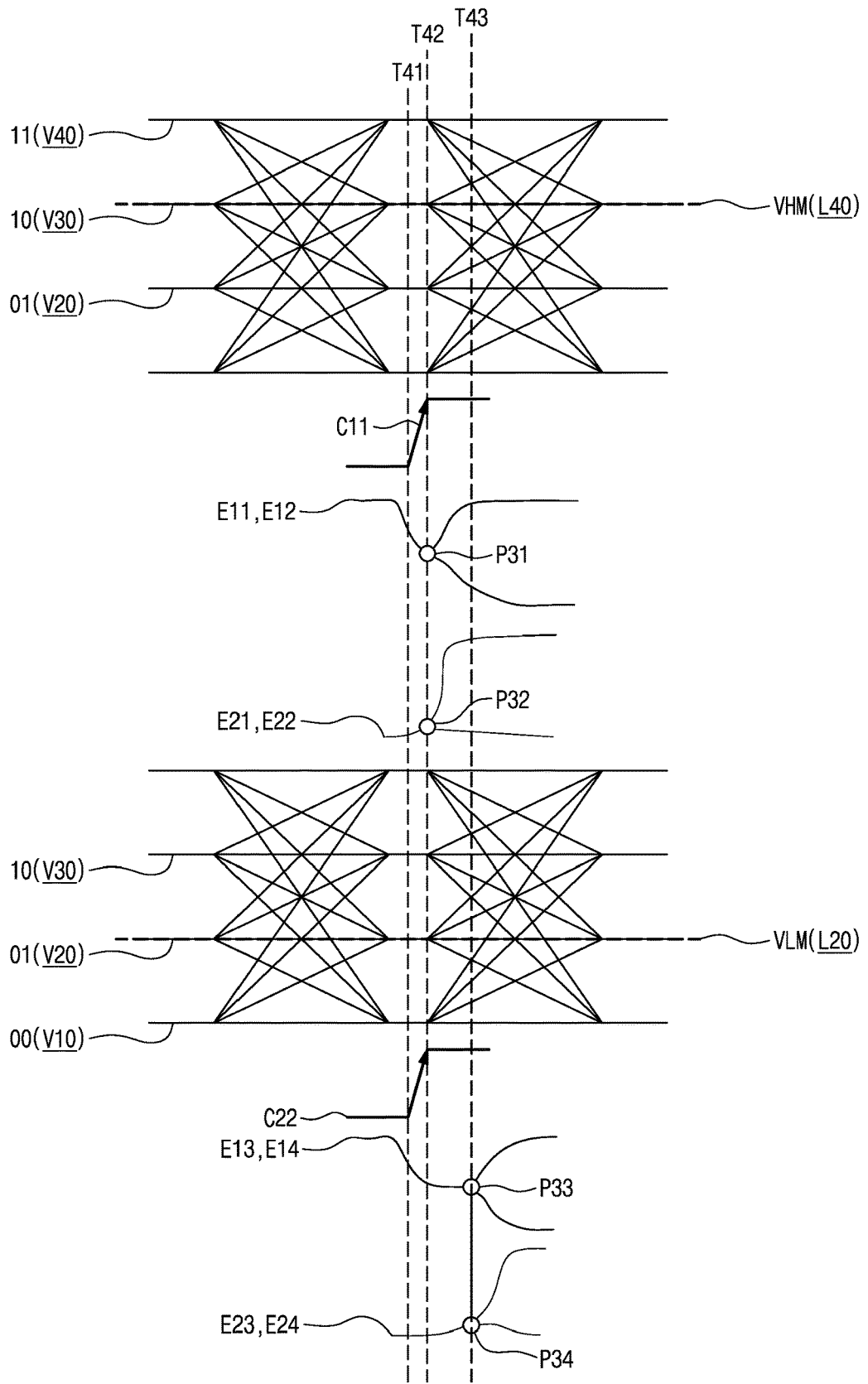
FIG. 8 is a drawing illustrating a form where a signal is changed when signal "01" is input to a time-based decoder.

FIG. 7 is a drawing illustrating a form where a signal is changed when signal "10" is input to a time-based decoder. FIG. 8 is a drawing illustrating a form where a signal is changed when signal "01" is input to a time-based decoder. Referring to FIG. 7, an eye diagram in which VHM(L40) is illustrated, sampling clocks C11 and C12, and output signals E11, E12, E13, and E14 of a VHM internal comparator 3N31 may be identified. Furthermore, an output signal E21 of a first phase inverter 3N32 of a VHM comparator 3N30, an output signal E22 of a third phase inverter 3N34 of the VHM comparator 3N30, an output signal E23 of a first phase inverter 3N42 of a VLM comparator 3N40, and an output signal E24 of a third phase inverter 3N44 of the VLM comparator 3N40 may be identified.

When receiving a signal of 10(V30), "+1V", a time-based decoder 3N50 may determine No. 2 data recovery value DR2 and No. 2 data recovery opposite value DR2B using the amount of current according to a voltage difference between VHM(L40) and VLM(L20). A description will be given of the time-based decoder 3N50 in an order of times T31, T32, and T33, because of using the amount of change according to the order of times T31, T32, and T33.

At timing T31, because 10(V30) of the signal applied to a VHM internal comparator 3N31 and voltage intensity of VHM(L40) are almost the same as each other, the amount of current due to a voltage difference may have an insignificant value. In the VHM internal comparator 3N31, the amount of current enough to be distinguished is accumulated only at a time point T33 after a considerable time elapses from the time point T31 of the sampling clock C11.

At timing T33, the output signals E11 and E12 of the VHM internal comparator 3N31 branch to "0" or "1" (P21) and branch to "1" or "0" of the inverted signals E21 and E22 (P22). However, because there is a difference between 10(V30) of a signal input to the VLM comparator 3N40 and a voltage intensity value of VHM(L40), the amount of current enough to branch (P23 and P24) is accumulated at a time point T32 after a short time elapses.

Between timing T32 and timing T33, the time-based decoder 3N50 may recognize that the amount of current input from the VLM comparator 3N40 is greater than the amount of current input from the VHM comparator 3N30 to determine the signal of 10(V30). Thus, because of determining the signal of 10(V30), the time-based decoder 3N50 may output No. 2 data recovery value DR2 as "1" and may output No. 2 data recovery opposite value DR2B as "0".

Referring to FIG. 8, an eye diagram in which VHM(L40) is illustrated, sampling clocks C21 and C22, and output signals E11, E12, E13, and E14 of a VHM internal comparator 3N31 may be identified. Furthermore, an output signal E21 of a first phase inverter 3N32 of a VHM comparator 3N30, an output signal E22 of a third phase inverter 3N34 of the VHM comparator 3N30, an output signal E23 of a first phase inverter 3N42 of a VLM comparator 3N40, and an output signal E24 of a third phase inverter 3N44 of the VLM comparator 3N40 may be identified.

When receiving a signal of 01(V20), "−1V", the time-based decoder 3N50 may determine No. 2 data recovery value DR2 and No. 2 data recovery opposite value DR2B using the amount of current according to a voltage difference between VLM(L20) and VHM(L40). A description will be given of the time-based decoder 3N50 in an order of times T31, T32, and T33, because of using the amount of change according to the order of times T31, T32, and T33.

At timing T31, because 01(V20) of the signal applied to the VLM internal comparator 3N41 and voltage intensity of VLM(L20) are almost the same as each other, the amount of current due to a voltage difference may have an insignificant value. In the VLM internal comparator (3N41), the amount of current enough to be distinguished is accumulated only at a time point T33 after a considerable time elapses from the time point T31 of the sampling clock C11.

At timing T33, the output signals E13 and E14 of the VLM internal comparator 3N41 branch to "0" or "1" (P33) and branch to "1" or "0" of the inverted signals E21 and E22 (P34). However, because there is a difference between 01(V20) of a signal input to the VHM internal comparator 3N31 and a voltage intensity value of VHM(L40), the amount of current enough to be distinguished is accumulated at a time point T32 after a short time elapses.

Between timing T32 and timing T33, the time-based decoder 3N50 may recognize that the amount of current input from the VHM comparator 3N30 is greater than the amount of current input from the VLM comparator 3N40 to determine the signal of 01(V20). Because of determining the signal of 01(V20), the time-based decoder 3N50 may output No. 2 data recovery value as "0" and may output No. 2 data recovery opposite value DR2B as "1".

Figures 9, 10:
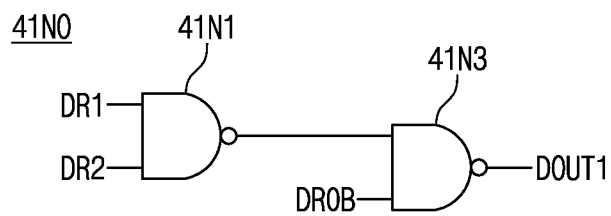
FIG. 9 is a circuit diagram illustrating in detail a configuration of a data recoverer of FIG. 5.
FIG. 10 is a truth table for values input to a data recoverer of FIG. 9.

FIG. 9 is a circuit diagram illustrating in detail a configuration of a data recoverer of FIG. 5. Referring to FIG. 9, a data recoverer 41N0 may include a first gate 41N1, a second gate 41N2, a third gate 41N3, and a fourth gate 41N4. Because each gate is a NAND gate, it outputs "0" only when "1" and "1" are input to both terminals and outputs "1" if not so.

The first gate 41N1 may receive No. 1 data recovery value DR1 of a VL comparator 3N20 and No. 2 data recovery value DR2 of a time-based decoder 3N50. An output value of the first gate 41N1 is an input value of the third gate 41N3.

The second gate 41N2 may receive No. 1 data recovery value DR1 of the VL comparator 3N20 and No. 2 data recovery opposite value DR2B of the time-based decoder 3N50. An output value of the second gate 41N2 is an input value of the fourth gate 41N4.

The third gate 41N3 may receive the output value of the first gate 41N1 and No. 0 data recovery opposite value DR0B of a VH comparator 3N10. An output value of the third gate 41N3 is a first value DOUT1 of the recovered data.

The fourth gate 41N4 may receive the output value of the second gate 41N2 and No. 0 data recovery opposite value DR0B of a VH comparator 3N10. An output value of the fourth gate 41N4 is a second value DOUT2 of the recovered data.

FIG. 10 is a truth table for values input to a data recoverer of FIG. 9. Referring to FIG. 10, the recovered data value DR0, No. 1 data recovery value DR1, No. 2 data recovery value DR2, and result values of respective gates may be identified for voltage values −3V(00(V10)), −1V(01(V20)), +1V(10(V30)), and +3V(11(V40)) input to a data recoverer 41N0. For example, when +3V(11(V40)) is input, all of DR0, No. 1 data recovery value DR1, and No. 2 data recovery value DR2 may output "1". Because of receiving "1" and "1", the first gate 41N1 may output "0". Because of receiving "1" and "0", the second gate 41N2 may output "1". Next, because of receiving "0" and "0", the third gate 41N3 may output "1". Because of receiving "1" and "0", the fourth gate 41N4 may output "1". Thus, a final output value may be recovered as "1" and "1".

Figure 11:
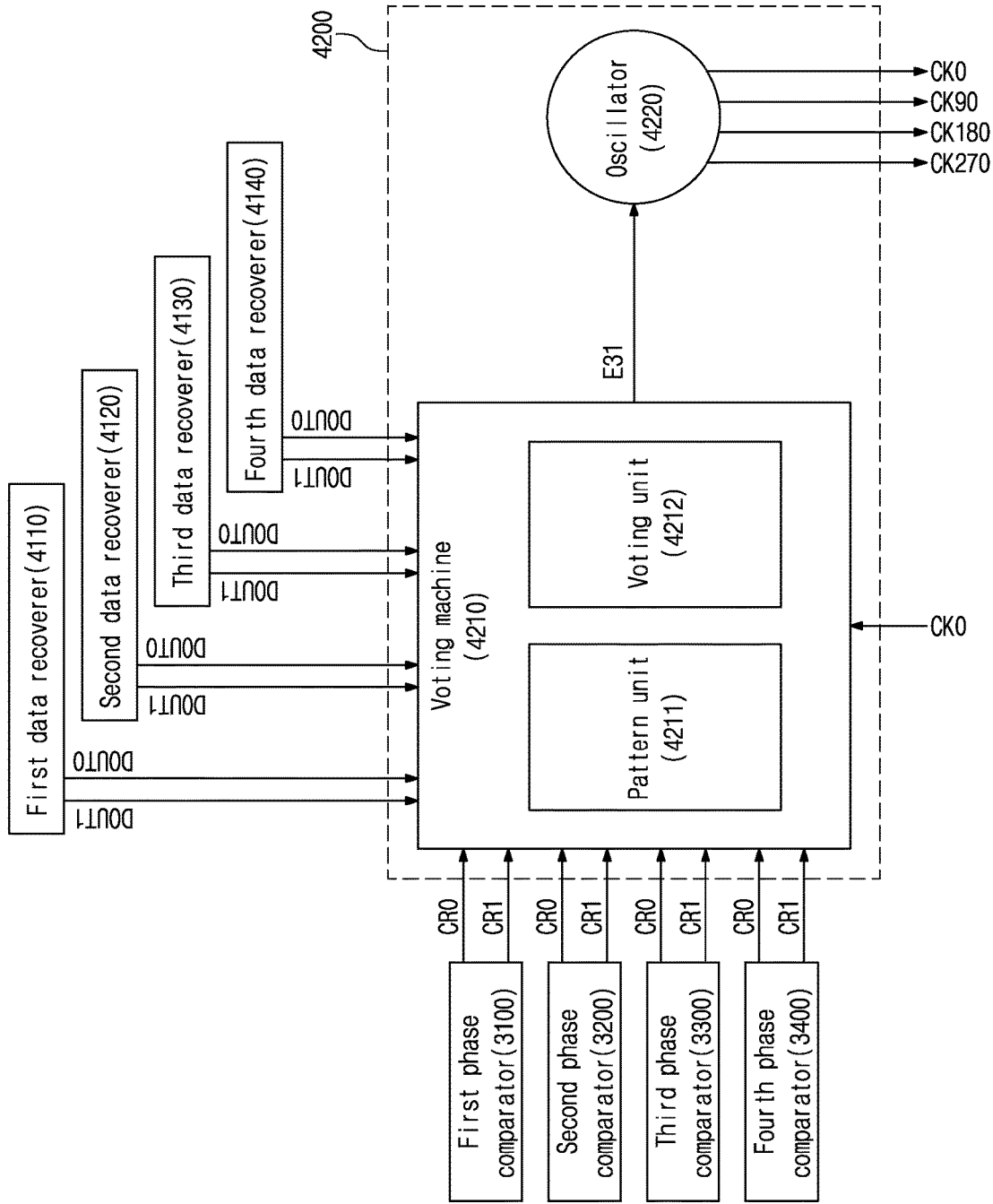
FIG. 11 is a configuration diagram illustrating in detail a configuration of a clock recoverer of FIG. 5.

FIG. 11 is a configuration diagram illustrating in detail a configuration of a clock recoverer of FIG. 5. Referring to FIG. 11, a clock recovery unit 4200 may include a voting machine 4210 and an oscillator 4220. The clock recovery unit 4200 may generate a signal for adjusting a clock to perform sampling at an accurate timing.

The voting machine 4210 may include a pattern unit 4211 and a voting unit 4212. The voting machine 4210 may receive No. 0 clock recovery value CR0 and No. 1 clock recovery value CR1 from each phase comparator 3N00 and may receive a first value DOUT1 of the recovered data and a second value DOUT0 of the recovered data from each data recoverer 41N0. The voting machine 4210 may output a clock adjustment signal E31. Operations of the voting machine 4210 and a detailed configuration (the pattern unit 4211 and the voting unit 4212) will be described below with reference to FIGS. 12 and 13.

The oscillator 4220 may be composed of a digitally controlled oscillator (DCO) capable of being adjusted by a digital value. The oscillator 4220 may receive the clock adjustment signal E31 which is a digital value and may adjust a clock timing to generate a clock.

Figure 12:
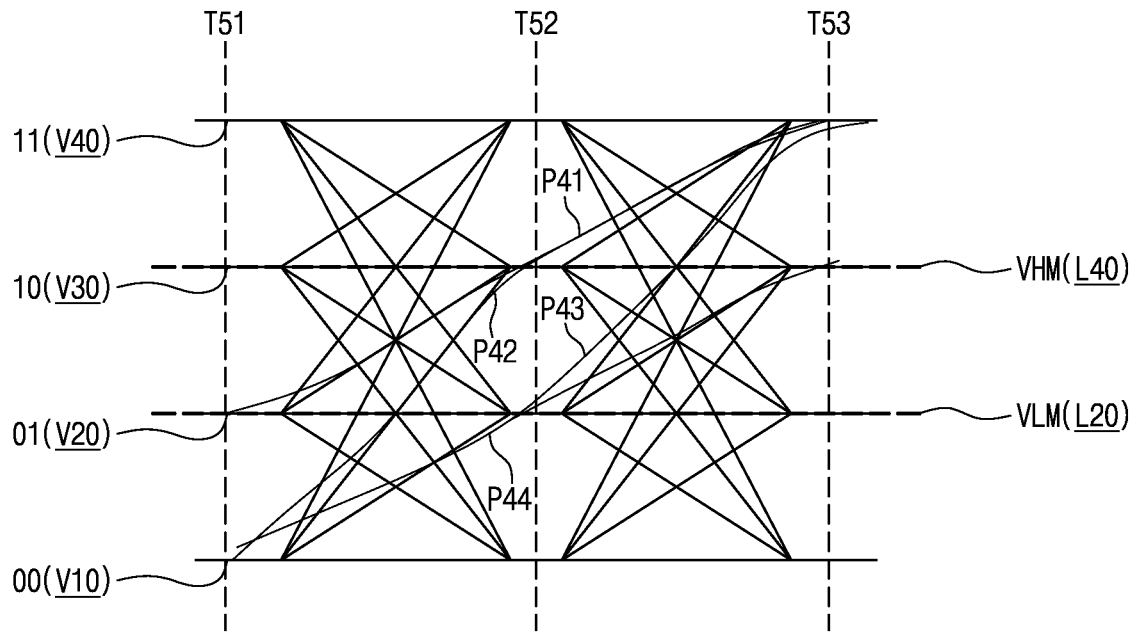
FIG. 12 is a drawing illustrating an operation according to a pattern of a clock recovery unit.
Figure 13:
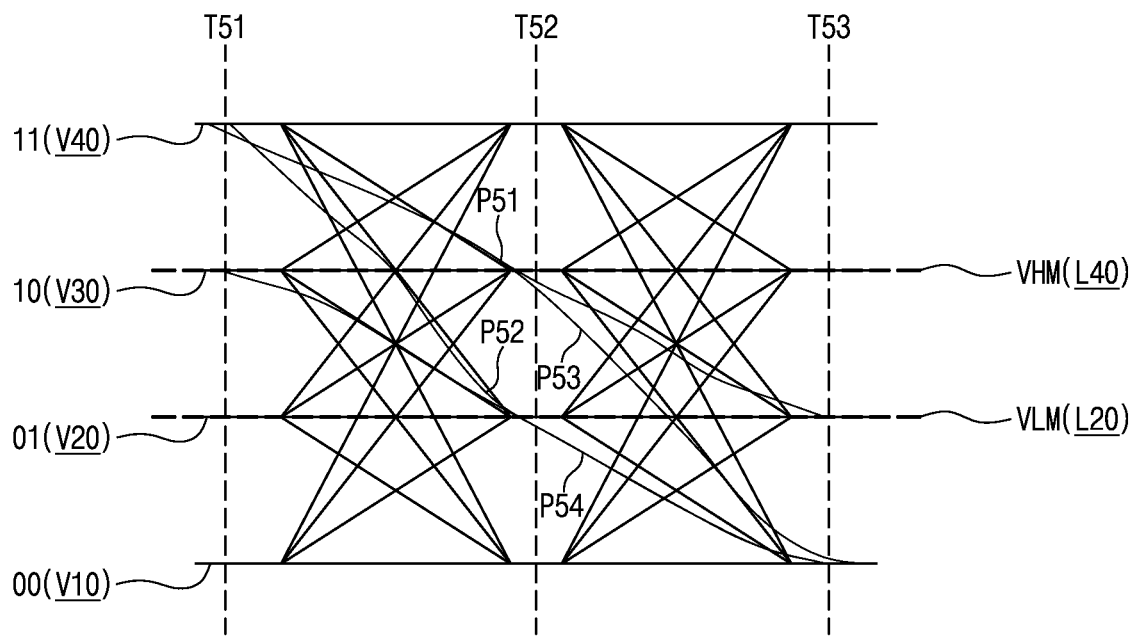
FIG. 13 is a drawing illustrating an operation according to another pattern of a clock recovery unit.

FIG. 12 is a drawing illustrating an operation according to a pattern of a clock recovery unit. FIG. 13 is a drawing illustrating an operation according to another pattern of a clock recovery unit. Referring to FIGS. 12 and 13, a clock recovery unit 4200 of FIG. 11 may use four rising patterns P41, P42, P43, and P44 and four falling patterns P51, P52, P53, and P54 at three timings T51, T52, and T53 or T61, T62, and T63.

A pattern unit 4211 of FIG. 11 may store data of the three timings T51, T52, and T53. The three timings T51, T52, and T53 used by the pattern unit 4211 may be consecutive timings, which may be any one of timings CK0, CK90, and CK180 starting at CK0, timings CK90, CK180, and CK270 starting at CK90, timings CK180, CK270, and CK0 starting at CK180, and timings CK270, CK0, and CK90 starting at CK270.

The pattern unit 4211 may use four rising patterns P41, P42, P43, and P44 and four falling patterns P51, P52, P53, and P54 among 64 patterns (=4×4×4) capable of appearing. The rising patterns P41, P42, P43, and P44 and the falling patterns P51, P52, P53, and P54 used by the pattern unit 4211 rise or fall at the three timings T51, T52, and T53. The rising pattern P41 used by the pattern unit 4211 is 01, 10, and 11. The rising pattern P42 used by the pattern unit 4211 is 00, 10, and 11. The rising pattern P43 used by the pattern unit 4211 is 00, 01, and 11. The rising pattern P44 used by the pattern unit 4211 is 00, 01, 10. The falling pattern P51 used by the pattern unit 4211 is 11, 10, and 01. The falling pattern P52 used by the pattern unit 4211 is 11, 01, and 00. The falling pattern P53 used by the pattern unit 4211 is 11, 10, and 00. The falling pattern P54 used by the pattern unit 4211 is 10, 01, and 00.

A description will be given of one P41 of the rising patterns to describe an operation of the pattern unit 4211. By storing data values of three timings, the pattern unit 4211 may identify 01(V20), 10(V30), and 11(V40) at timing T53. Thus, like that described in FIG. 3, the pattern unit 4211 may compare a voltage value of 10(V30) with a voltage value of VHM(L40). When the voltage value of 10(V30) is less than the voltage value of VHM(L40), the pattern unit 4211 may determine that a clock is located at a left lower end to generate an early signal. When the voltage value of 10(V30) is greater than the voltage value of VHM(L40), the pattern unit 4211 may determine that the clock is located at a right upper end to generate a late signal.

For example, the pattern unit 4211 may sequentially receive 00(V10), 01(V20), 10(V30), 11(V40), and 11(V40). The pattern unit 4221 may fine the pattern P44 at the first three timings 00(V10), 01(V20), and 10(V30), may find the pattern P41 at the middle three timings 01(V20), 10(V30), and 11(V40), but may not find a pattern at the last three timings 10(V30), 11(V40), and 11(V40).

The pattern unit 4211 may generate an early signal in the pattern P44 at the first three timings, may generate an early signal in the pattern P41 at the middle three timings, and may generate a no pattern signal at the last three timings.

The voting unit 4212 may output a clock adjustment signal E31 using the early signal, the late signal, or the no pattern signal generated at the respective clocks by the pattern unit 4211. The voting unit 4212 may receive the early signal, the early signal, and the no pattern signal generated by the pattern unit 4211 in the example above and may determine that the early signal occupies half. When determining that the early signal occupies half, the voting unit 4212 may generate the clock adjustment signal E31 for moving the clock to the right.

The oscillator 4220 may receive the clock adjustment signal E31 for moving the clock to the right to generate an adjusted clock.

An existing PAM-4 receiver performs sampling in 8 phases CK0, CK90, CK180, CK270+CK45, CK135, CK225, and CK315, whereas a PAM-4 receiver using pattern-based CDR circuitry may perform sampling in four phases CK0, CK90, CK180, and CK270 to recover a clock and data.

Furthermore, the existing PAM-4 receiver uses five comparators VH, VHM, VM, VLM, and VL at the respective sampling clocks CK0, CK90, CK180, and CK270, whereas the PAM-4 receiver using the pattern-based CDR circuitry may use only four comparators VH, VHM, VLM, and VL to implement performance of the same level with less power used.

The PAM-4 receiver according to the present disclosure may recover a clock and data using less comparators, thus maintaining the same baud-rate while using less power which is the same as that of an existing system.

The above-mentioned contents are detailed embodiments for executing the present disclosure. Embodiments in which a design is changed simply or which are easily changed may be included in the present disclosure as well as an embodiment described above. Furthermore, the present disclosure may also include technologies capable of being easily modified and executed using embodiments. While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A pulse amplitude modulation-4 (PAM-4) receiver, comprising:
   an analog front end configured to receive an external signal and recover channel loss to output a refined PAM-4 signal;
   a comparison unit configured to receive the PAM-4 signal and compare the PAM-4 signal with a reference voltage to generate a recovery signal; and
   a recovery unit configured to receive the recovery signal and recover data and a clock,
   wherein the analog front end includes:
   an equalizer configured to match amplitudes of all frequency components of the external signal; and
   an amplifier configured to amplify an output signal of the equalizer, and
   wherein the comparison unit includes:
   a first phase comparator configured to compare the PAM-4 signal with the reference voltage, when the clock is 0 degree;
   a second phase comparator configured to compare the PAM-4 signal with the reference voltage, when the clock is 90 degrees;
   a third phase comparator configured to compare the PAM-4 signal with the reference voltage, when the clock is 180 degrees; and
   a fourth phase comparator configured to compare the PAM-4 signal with the reference voltage, when the clock is 270 degrees.

2. The PAM-4 receiver of claim 1, wherein each of the first to fourth phase comparators includes:
   a high voltage (VH) comparator configured to output No. 0 data recovery value and No. 0 data recovery opposite value;
   a low voltage (VL) comparator configured to output No. 1 data recovery value and No. 1 data recovery opposite value using a signal differential voltage between a positive voltage and a negative voltage and a reference low voltage;
   a middle high voltage (VHM) comparator configured to output a first positive-side switching signal, a first negative-side switching signal, No. 0 clock recovery value, and No. 0 data recovery opposite value using the signal differential voltage between the positive voltage and the negative voltage and a reference middle high voltage;
   a middle low voltage (VLM) comparator configured to output a second positive-side switching signal, a second negative-side switching signal, No. 1 clock recovery value, and No. 1 clock recovery opposite value using the signal differential voltage between the positive voltage and the negative voltage and a reference middle low voltage; and
   a time-based decoder configured to output No. 2 data recovery value using the first positive-side switching signal and the first negative-side switching signal of the VHM comparator and the second positive-side switching signal and the second negative-side switching signal of the VLM comparator.

3. The PAM-4 receiver of claim 2, wherein the VH comparator includes:
   a VH internal comparator configured to compare the signal differential voltage between the positive voltage and the negative voltage with a reference high voltage to output a signal corresponding to "1" or "0" at a positive-side output side and output a signal corresponding to "0" or "1" at a negative-side output side;
   a first phase inverter configured to receive the signal of the positive-side output side of the VH internal comparator and switch a phase of the received signal;
   a second phase inverter configured to receive a signal of the first phase inverter and switch a phase of the received signal;
   a third phase inverter configured to receive the signal of the negative-side output side of the VH internal comparator and switch a phase of the received signal;
   a fourth phase inverter configured to receive a signal of the second phase inverter and switch a phase of the received signal; and
   a set-reset (SR) latch configured to receive an output signal of the second phase inverter and an output signal of the fourth phase inverter and output "0" or "1", and
   wherein the VL comparator includes:
   a VL internal comparator configured to compare the signal differential voltage between the positive voltage and the negative voltage with the reference low voltage to output a signal corresponding to "1" or "0" at a positive-side output side and output a signal corresponding to "0" or "1" at a negative-side output side;

a first phase inverter configured to receive the signal of the positive-side output side of the VL internal comparator and switch a phase of the received signal;

a second phase inverter configured to receive a signal of the first phase inverter and switch a phase of the received signal;

a third phase inverter configured to receive the signal of the negative-side output side of the VL internal comparator and switch a phase of the received signal;

a fourth phase inverter configured to receive a signal of the second phase inverter and switch a phase of the received signal; and an SR latch configured to receive an output signal of the second phase inverter and an output signal of the fourth phase inverter and output "0" or "1".

4. The PAM-4 receiver of claim 2, wherein the VHM comparator includes:

a VHM internal comparator configured to compare the signal differential voltage between the positive voltage and the negative voltage with the reference middle high voltage to output a signal corresponding to "1" or "0" at a positive-side output side and output a signal corresponding to "0" or "1" at a negative-side output side;

a first phase inverter configured to receive the signal of the positive-side output side of the VHM internal comparator and switch a phase of the received signal to output a first positive-side switching signal;

a second phase inverter configured to receive the first positive-side switching signal and switch a phase of the first positive-side switching signal;

a third phase inverter configured to receive the signal of the negative-side output side of the VHM internal comparator and switch a phase of the received signal to output a first negative-side switching signal;

a fourth phase inverter configured to receive the first negative-side switching signal and switch a phase of the first negative-side switching signal; and an SR latch configured to receive an output signal of the second phase inverter and an output signal of the fourth phase inverter and output "0" or "1", and wherein the VLM comparator includes:

a VLM internal comparator configured to compare the signal differential voltage between the positive voltage and the negative voltage with the reference middle low voltage to output a signal corresponding to "1" or "0" at a positive-side output side and output a signal corresponding to "0" or "1" at a negative-side output side;

a first phase inverter configured to receive the signal of the positive-side output side of the VLM internal comparator and switch a phase of the received signal to output a second positive-side switching signal;

a second phase inverter configured to receive the second positive-side switching signal and switch a phase of the second positive-side switching signal;

a third phase inverter configured to receive the signal of the negative-side output side of the VLM internal comparator and switch a phase of the received signal to output a second negative-side switching signal;

a fourth phase inverter configured to receive the second negative-side switching signal and switch a phase of the second negative-side switching signal; and an SR latch configured to receive an output signal of the second phase inverter and an output signal of the fourth phase inverter and output "0" or "1".

5. The PAM-4 receiver of claim 4, wherein the time-based decoder receives the first positive-side switching signal, the first negative-side switching signal, the second positive-side switching signal, and the second negative-side switching signal and outputs No. 2 data recovery value using a difference between an amount of current according to a difference between the first positive-side switching signal and the first negative-side switching signal and an amount of current according to a difference between the second positive-side switching signal and the second negative-side switching signal.

6. The PAM-4 receiver of claim 1, wherein the recovery unit includes:

a data recovery unit configured to receive data recovery values from first to fourth phase comparators and recover the data; and a clock recovery unit configured to receive clock recovery values from the first to fourth phase comparators and recover the clock.

7. The PAM-4 receiver of claim 6, wherein the data recovery unit includes:

a first data recoverer configured to receive a first recovery signal of the first phase comparator and recover the data;

a second data recoverer configured to receive a second recovery signal of the second phase comparator and recover the data;

a third data recoverer configured to receive a third recovery signal of the third phase comparator and recover the data; and a fourth data recoverer configured to receive a fourth recovery signal of the fourth phase comparator and recover the data, and wherein each of the first to fourth data recoverers recovers the data using a NAND gate.

8. The PAM-4 receiver of claim 6, wherein the clock recovery unit includes:

a voting machine configured to generate a clock adjustment signal using No. 0 clock recovery value, No. 1 clock recovery value, a first value of the adjusted data, and a second value of the recovered data; and an oscillator configured to receive the clock adjustment signal and generate an adjusted clock.

9. The PAM-4 receiver of claim 8, wherein the voting machine includes:

a pattern unit configured to find four rising patterns and four falling patterns for three consecutive timings and generate an early signal, a late signal, and a no pattern signal using the four rising patterns and the four falling patterns; and a voting unit configured to generate the clock adjustment signal on the basis of a signal occupying half of the early signal, the late signal, and the no pattern signal generated by the pattern unit.

10. A pulse amplitude modulation-4 (PAM-4) receiver, comprising:

an analog front end configured to receive an external signal and recover channel loss to output a refined PAM-4 signal;

a comparison unit configured to receive the PAM-4 signal and compare the PAM-4 signal with a reference voltage to generate a recovery signal; and a recovery unit configured to receive the recovery signal and recover data and a clock, wherein the analog front end includes:

an equalizer configured to match amplitudes of all frequency components of the external signal; and an amplifier configured to amplify an output signal of the equalizer, wherein the recovery unit includes:

a data recovery unit configured to receive data recovery values from first to fourth phase comparators and recover the data; and a clock recovery unit configured to receive clock recovery values from the first to fourth phase comparators and recover the clock, and wherein the data recovery unit includes:

a first data recoverer configured to receive a first recovery signal of the first phase comparator and recover the data;

a second data recoverer configured to receive a second recovery signal of the second phase comparator and recover the data;

a third data recoverer configured to receive a third recovery signal of the third phase comparator and recover the data; and a fourth data recoverer configured to receive a fourth recovery signal of the fourth phase comparator and recover the data, and wherein each of the first to fourth data recoverers recovers the data using a NAND gate.

11. A pulse amplitude modulation-4 (PAM-4) receiver, comprising:

an analog front end configured to receive an external signal and recover channel loss to output a refined PAM-4 signal;

a comparison unit configured to receive the PAM-4 signal and compare the PAM-4 signal with a reference voltage to generate a recovery signal; and a recovery unit configured to receive the recovery signal and recover data and a clock, wherein the analog front end includes:

an equalizer configured to match amplitudes of all frequency components of the external signal; and an amplifier configured to amplify an output signal of the equalizer, wherein the recovery unit includes:

a data recovery unit configured to receive data recovery values from first to fourth phase comparators and recover the data; and a clock recovery unit configured to receive clock recovery values from the first to fourth phase comparators and recover the clock, and wherein the clock recovery unit includes:

a voting machine configured to generate a clock adjustment signal using No. 0 clock recovery value, No. 1 clock recovery value, a first value of the adjusted data, and a second value of the recovered data; and an oscillator configured to receive the clock adjustment signal and generate an adjusted clock.

\* \* \* \* \*